(12) United States Patent
Tsuboi et al.

(10) Patent No.: US 10,044,961 B2
(45) Date of Patent: Aug. 7, 2018

(54) IMAGE PICKUP DEVICE, IMAGE PICKUP SYSTEM, AND MOVING BODY

(71) Applicant: CANON KABUSHIKI KAISHA, Tokyo (JP)

(72) Inventors: Hiromasa Tsuboi, Tama (JP); Takehiko Soda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/490,228

(22) Filed: Apr. 18, 2017

(65) Prior Publication Data

US 2017/0310914 A1 Oct. 26, 2017

(30) Foreign Application Priority Data

Apr. 22, 2016 (JP) ................................. 2016-086547

(51) Int. Cl.
*H04N 5/374* (2011.01)
*H01L 27/146* (2006.01)
*H04N 5/378* (2011.01)

(52) U.S. Cl.
CPC ....... *H04N 5/374* (2013.01); *H01L 27/14621* (2013.01); *H01L 27/14634* (2013.01); *H04N 5/378* (2013.01)

(58) Field of Classification Search
CPC .. H04N 5/374; H04N 5/378; H01L 27/14621; H01L 27/14634
See application file for complete search history.

(56) References Cited

U.S. PATENT DOCUMENTS

| 7,511,275 | B2 * | 3/2009 | Mabuchi | .............. | H04N 5/3559 250/340 |
| 8,513,721 | B2 * | 8/2013 | Zhu | ................... | H01L 27/14612 257/233 |
| 9,787,923 | B2 * | 10/2017 | Petilli | .................. | H04N 5/3696 |
| 2016/0006966 | A1 * | 1/2016 | Murakami | ............. | H04N 5/378 348/308 |

FOREIGN PATENT DOCUMENTS

JP 2007535199 A 11/2007

* cited by examiner

*Primary Examiner* — Padma Haliyur
(74) *Attorney, Agent, or Firm* — Canon U.S.A., Inc. IP Division

(57) ABSTRACT

The capacitance value of the input node is set to a first capacitance value when a first potential is supplied to the switch. The capacitance value of the input node is set to a second capacitance value which is smaller than the first capacitance value when a second potential is supplied to the switch. The potential supplied to the switch is kept at a third potential which is a potential between the first potential and the second potential in a part of at least one of a period until the potential is set to the first potential from the second potential and a period until the potential is set to the second potential from the first potential.

20 Claims, 7 Drawing Sheets

IMAGE PICKUP DEVICE, IMAGE PICKUP SYSTEM, AND MOVING BODY

BACKGROUND OF THE INVENTION

Field of the Invention

The aspect of the embodiments relates to an image pickup device, an image pickup system, and a moving body.

Description of the Related Art

A configuration to provide capacitance so that a capacitance value of an input node of an amplifying transistor (hereafter, "input node") becomes switchable to expand a dynamic range of a signal output from a pixel has been proposed. The capacitance value of the input node may be increased by connecting the capacitance to the input node with a switch, for example, and the capacitance value of the input node may be reduced by disconnecting. An amount of electric charge which can be processed at the input node may be increased by increasing the capacitance value. A gain of the amplifying transistor may be increased by reducing the capacitance value.

In PCT Japanese Translation Patent Publication No. 2007-535199, for example, an electrode which constitutes a part of capacitance works as a switch for switching capacitance values. An electrically connected state and an electrically disconnected state of the capacitance to an input node are switched by changing a potential supplied to the electrode from a first potential to a second potential.

SUMMARY OF THE INVENTION

According to an aspect of the embodiments, an image pickup device which includes a plurality of pixels each of which includes: a photoelectric conversion unit; an amplifying transistor provided with an input node in which a charge generated in the photoelectric conversion unit is input; a transfer transistor configured to switch a connection and a disconnection between the photoelectric conversion unit and the input node; a reset transistor configured to switch a connected state and a disconnected state between the input node and a power supply wire; and a switch connected to the input node, wherein the image pickup device further includes a potential supply unit configured to supply the switch with a first potential, a second potential, and a third potential which is a potential between the first potential and the second potential.

Further features of the disclosure will become apparent from the following description of exemplary embodiments with reference to the attached drawings.

DESCRIPTION OF THE EMBODIMENTS

Figure 1A:
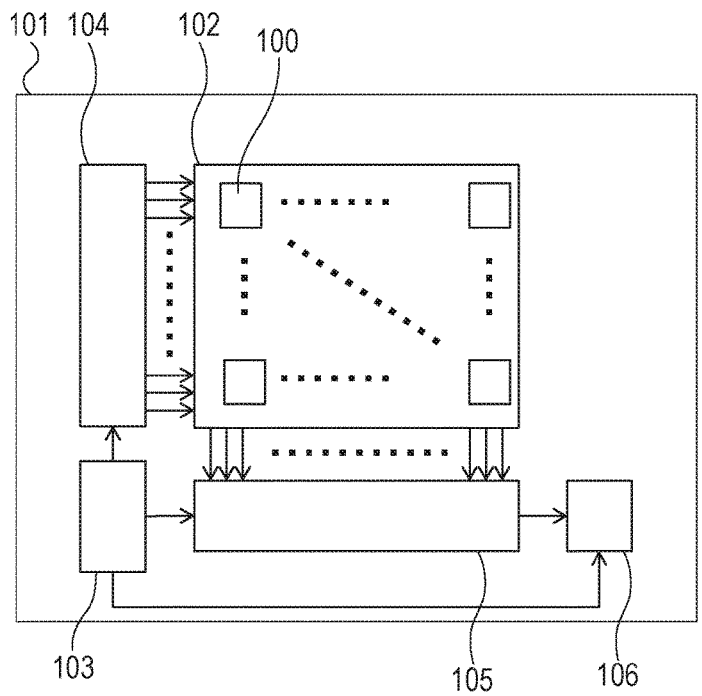
FIG. 1A is a block diagram of an image pickup device and FIG. 1B is an equivalent circuit diagram of pixels.

Regarding the approach described in PCT Japanese Translation Patent Publication No. 2007-535199, there is a possibility that, when a potential supplied to a switch for switching a capacitance value of an input node of an amplifying transistor is switched, a potential of an input node is varied depending on coupling capacitance produced between a semiconductor region which constitutes a part of the input node and the switch.

Time until the potential is stabilized to a desired value after the potential of the input node is varied is determined depending on a magnitude of the coupling capacitance. Since the magnitude of the coupling capacitance is uneven among pixels, the time until the potential of the input node is stabilized may become uneven among a plurality of pixels. In that case, even if light enters uniformly to an image pickup surface, signals may be output unevenly from the pixels and, as a result, a correct image cannot be obtained.

The disclosure provides a technique to obtain a correct image even if a potential supplied to a switch for switching a capacitance value of an input node of an amplifying transistor is varied.

In the following description, a conductivity type the same as that of a signal charge is defined as a first conductivity type, and a conductivity type opposite to that of the signal charge is defined to as a second conductivity type. In the following description, the charge of the first conductivity type is described as electrons, the charge of the second conductivity type is described as holes, and each transistor is described as an NMOS transistor. Alternatively, however, the charge of the first conductivity type may be holes, the charge of the second conductivity type may be electrons, and each transistor may be a PMOS transistor.

First Embodiment

The present embodiment will be described with reference to FIGS. 1A, 1B, 2A, 2B, and 3. The components denoted by the same reference numerals in the drawings are the same element or the same area.

FIG. 1A is a block diagram of an image pickup device of the present embodiment. An image pickup device 101 includes a pixel unit 102, a driving pulse generation unit 103, a vertical scanning circuit 104, a signal processing unit 105, and an output unit 106.

A plurality of pixels 100 are provided in the pixel unit 102. A plurality of pixels 100 are arranged in a matrix form, and sequentially output electrical signals converted in the pixels 100 from each pixel row.

The driving pulse generation unit 103 generates driving pulses. The vertical scanning circuit 104 receives the driving pulses from the driving pulse generation unit 103 and supplies the driving pulses to each pixel. The signal processing unit 105 at least serializes signals output in parallel from a plurality of pixel columns, and transmits the signals to the output unit 106. The signal processing unit 105 may include a column circuit which corresponds to each of the pixel columns and performs signal amplification, AD conversion, etc.

Figure 1B:
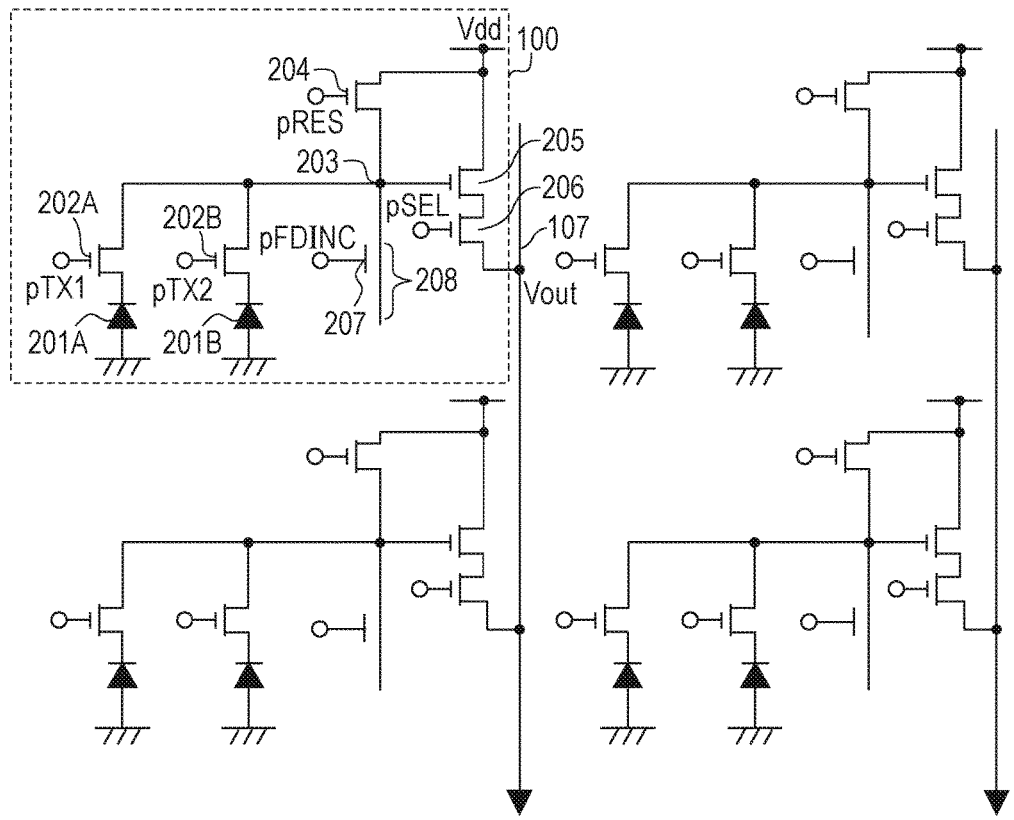

FIG. 1B illustrates an equivalent circuit diagram of the pixel unit 102 of the image pickup device 101. Here, four pixels 100 are arranged. Alphabetic suffixes A and B are used to identify each member. The suffixes are used when each member is to be described separately.

The pixel 100 includes a plurality of photoelectric conversion units (a photoelectric conversion unit 201A and a photoelectric conversion unit 201B). In the photoelectric conversion units 201A and 201B, a charge pair in accordance with a quantity of incident light is generated, and a signal charge (hereafter, "electrons") is accumulated. The photoelectric conversion units 201A and 201B are, for example, photodiodes.

A transfer transistor 202A transfers the electrons generated in the photoelectric conversion unit 201A to floating diffusion (FD) 203. A transfer transistor 202B transfers the electrons generated in the photoelectric conversion unit 201B to the FD 203. A driving pulse pTX1 is supplied to a gate of the transfer transistor 202A and a driving pulse pTX2 is supplied to a gate of the transfer transistor 202B to switch between a connected state and a disconnected state.

The FD 203 is shared by the photoelectric conversion unit 201A and the photoelectric conversion unit 201B. The FD 203 holds the electrons transferred from the photoelectric conversion unit 201A and the photoelectric conversion unit 201B via each transfer transistor 202.

A gate of an amplifying transistor 205 is electrically connected to the FD 203, and amplifies and outputs signals in accordance with the electrons transferred to the FD 203. Specifically, the electrons transferred to the FD 203 are converted into a voltage in accordance with the quantity thereof, and electrical signals in accordance with the voltage are output outside of the pixel via the amplifying transistor 205. A drain of the amplifying transistor 205 is connected to a power supply wire to which a power supply voltage VDD is supplied, and a source of the amplifying transistor 205 constitutes an output node. The amplifying transistor 205 constitutes a source follower circuit together with an unillustrated current source.

A reset transistor 204 resets a voltage of an input node of the amplifying transistor 205 to a predetermined potential. A driving pulse pRES is supplied to a gate of the reset transistor 204 to switch between a connected state and a disconnected state.

A selection transistor 206 controls an electrical connection between an output node of the amplifying transistor 205 and a signal line 107. A drain of the selection transistor 206 is connected to the source of the amplifying transistor 205, and a source of the selection transistor 206 is connected to the signal line 107. A driving pulse pSEL is supplied to a gate of the selection transistor 206 to switch a connected state and a disconnected state.

The signal line 107 is arranged in a manner such that an electrically connected state and an electrically disconnected state between the signal line 107 and the output node of the amplifying transistor 205 of the pixel 100 of each pixel column of a plurality of pixels arranged in a matrix form can be switched.

Alternatively, the selection transistor 206 may be provided between the drain of the amplifying transistor 205 and the power supply wire to which the power supply voltage VDD is supplied. The selection transistor 206 may be omitted. In that case, the output node of the amplifying transistor 205 and the signal line 107 are connected to each other, and a potential of the drain or the input node of the amplifying transistor 205 is switched. Therefore, the electrically connected state between the output node of the amplifying transistor 205 and the signal line 107 may be switched. In any case, the selection transistor 206 controls the electrically connected state and the electrically disconnected state between the output node of the amplifying transistor 205 and the signal line 107.

Capacitance 208 constitutes a part of the input node of the amplifying transistor 205 in the connected state, and is separated from the input node in the disconnected state. A capacitance value of the input node of the amplifying transistor 205 is thus changeable. In the present embodiment, switching of the connected state and the disconnected state of the capacitance 208 is controlled by a switch 207. Therefore, the capacitance value of the input node of the amplifying transistor 205 is switched by a potential supplied to the switch 207.

A driving pulse pFDINC is supplied to the switch 207 for switching the connected state (an ON state) and the disconnected state (an OFF state). The connected state and the disconnected state of all of the switches 207 may be switched simultaneously.

The capacitance 208 and the switch 207 may share a part of their configuration. For example, the capacitance 208 may be configured by gate insulating film capacitance of the switch 207. If the switch 207 is a MOS transistor, the capacitance 208 may be configured by p-n junction capacitance and parasitic capacitance which are constituted by an N-type semiconductor region which constitutes a source. However, the capacitance 208 and the switch 207 may be configured by separate members.

The input node of the amplifying transistor 205 at least includes the FD 203, a gate electrode of the amplifying transistor 205, and a conductor which electrically connects the FD 203 and the gate electrode of the amplifying transistor 205.

When the capacitance 208 is set to a connected state, since a capacitance value of the FD 203 increases, charge-voltage conversion efficiency in the input node of the amplifying transistor 205 can be made lower than in the disconnected state.

Therefore, if the electrons transferred to the input node of the amplifying transistor 205 are constant, a magnitude of a voltage amplitude after being converted into a voltage at the input node of the amplifying transistor 205 is smaller than in the case where the capacitance value is not increased. Therefore, saturation of the voltage of the signal line 107 in a first quantity of incident light (higher illumination) may be prevented.

Since the capacitance value of the FD 203 is not increased when the capacitance 208 is set to a disconnected state, the charge-voltage conversion efficiency at the input node of the amplifying transistor 205 can be made higher than in the connected state.

Therefore, if the signal charges transferred to the input node of the amplifying transistor 205 are constant, a magnitude of a voltage amplitude after being converted into a voltage at the input node of the amplifying transistor 205 is larger than in the case where the capacitance value is increased. Therefore, a signal noise ratio (S/N ratio) in a second quantity of incident light (low illumination) which is smaller than the first quantity of incident light improves.

A plurality of photoelectric conversion units 201 and a plurality of transfer transistors 202 are arranged in a single pixel 100 here, but a single photoelectric conversion unit 201 and a single transfer transistor 202 may be arranged in a single pixel 100.

Figure 2A:
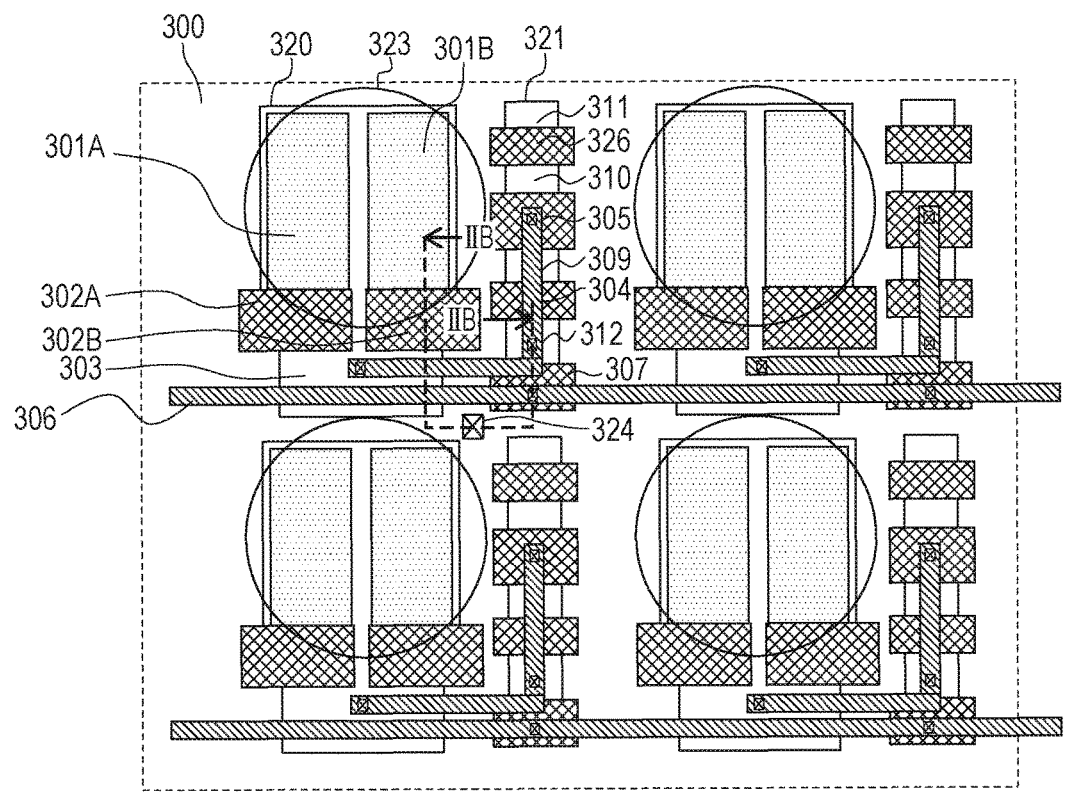
FIG. 2A is a schematic plan view and FIG. 2B is a schematic cross-sectional view of the image pickup device.
Figure 2B:
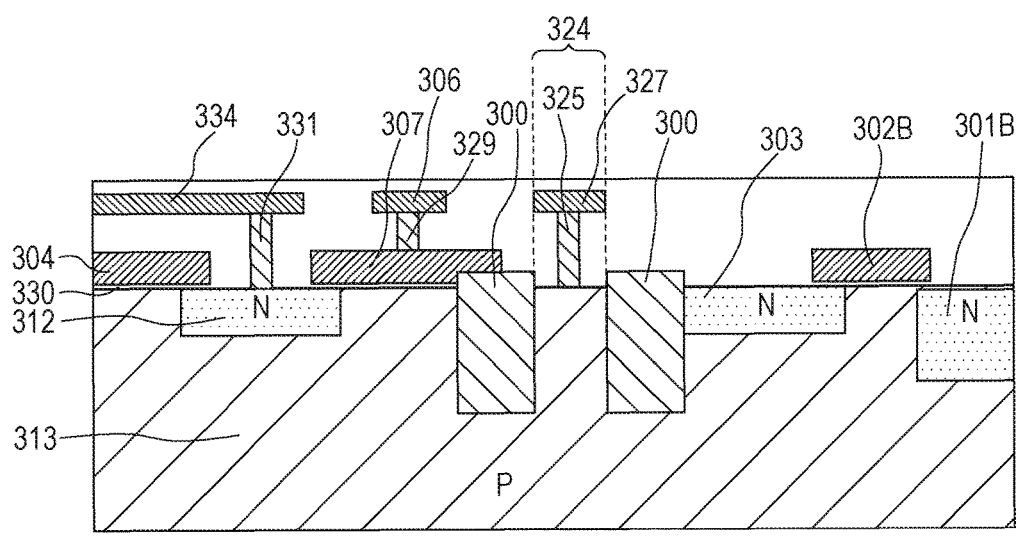

FIG. 2A is a schematic plan view and FIG. 2B is a schematic cross-sectional view of the image pickup device 101 of the present embodiment. The pixel unit 102 here has the pixels 100 arranged in 4 row and 2 columns, for example.

In FIG. 2A, the photoelectric conversion unit 201A, the photoelectric conversion unit 201B, the FD 203, and a semiconductor region which constitutes the transfer transistor 202 of FIG. 1B are disposed in a first active region 320. A semiconductor region which constitutes the reset transistor 204, the amplifying transistor 205, the selection transistor 206, and the capacitance 208 of FIG. 1B are disposed in a second active region 321. An electrode included in the switch 207 is disposed above the second active region 321.

Light which has passed through a microlens 323 enters the photoelectric conversion unit 201A and the photoelectric conversion unit 201B, respectively. An example in which a plurality of photoelectric conversion units (the photoelectric conversion units 201A and 201B) are disposed below each of the microlenses 323 in a plan view is described. However, in addition to a plurality of photoelectric conversion units, at least a part of an outer edge of a single pixel 100 may be disposed below the microlens 323.

Although not illustrated, a color filter is disposed below each microlens 323. An example in which an insulating separator is disposed as an element isolation portion 300 as a member which divides each active region in FIG. 2A will be described. However, a p-n junction isolation portion may be disposed as the element isolation portion 300.

An N-type semiconductor region 301A, an N-type semiconductor region 301B, and an N-type semiconductor region 303 are disposed in the first active region 320. The N-type semiconductor region 301A constitutes a part of the photoelectric conversion unit 201A. The N-type semiconductor region 301B constitutes a part of the photoelectric conversion unit 201B. The N-type semiconductor region 303 constitutes the FD 203.

A gate electrode 302A of the transfer transistor 202A and a gate electrode 302B of the transfer transistor 202B are disposed above the first active region 320 in a plan view. The N-type semiconductor region 301A, the gate electrode 302A, and the N-type semiconductor region 303 constitute the transfer transistor 202A. The N-type semiconductor region 301B, the gate electrode 302B, and the N-type semiconductor region 303 constitute the transfer transistor 202B.

An N-type semiconductor region 311, an N-type semiconductor region 310, an N-type semiconductor region 309, and an N-type semiconductor region 312 are disposed in the second active region 321. A gate electrode 326, a gate electrode 305, a gate electrode 304, and an electrode 307 are disposed in the second active region 321 in a plan view. A part of the electrode 307 is disposed in the element isolation portion 300. The electrode 307 is made of polysilicon, for example.

The N-type semiconductor region 311, the gate electrode 326, and the N-type semiconductor region 310 constitute the selection transistor 206. The N-type semiconductor region 310, the gate electrode 305, and the N-type semiconductor region 309 constitute the amplifying transistor 205. The N-type semiconductor region 309, the gate electrode 304, and the N-type semiconductor region 312 constitute the reset transistor 204. The electrode 307 is included in the switch 207.

The N-type semiconductor region 303, the N-type semiconductor region 312, and the gate electrode 305 are electrically connected with one another and constitute the input node of the amplifying transistor 205.

A conductive pattern 306 is a driving wire electrically connected to the electrode 307 which constitutes the switch 207 for supplying driving pulses pFDINC. A well contact region 324 is surrounded by the element isolation portion 300.

Next, a schematic cross-sectional view along line IIB-IIB of FIG. 2A will be described with reference to FIG. 2B. In FIG. 2B, the photoelectric conversion unit 201B includes a p-n junction constituted by a P-type semiconductor region 313 and the N-type semiconductor region 301B.

The FD 203 is constituted by the N-type semiconductor region 303. The N-type semiconductor region 303 constitutes a p-n junction together with the P-type semiconductor region 313 disposed therearound, and holds the electrons transferred from the photoelectric conversion unit 201 with capacitance constituted by the p-n junction.

A voltage supply wire 327 is connected to the P-type semiconductor region 313 via a contact plug 325 disposed in the well contact region 324. A reference voltage (e.g., 0V) is supplied from the voltage supply wire 327.

The N-type semiconductor region 312 and the element isolation portion 300 are disposed adjacent to each other via the electrode 307. The N-type semiconductor region 312 is electrically connected to the FD 203 via a contact plug 331 and a wire 334. The electrode 307 is electrically connected to the conductive pattern 306 via a contact plug 329. A P-type semiconductor region with higher impurity concentration than that of the P-type semiconductor region 313 may be disposed in the periphery of the element isolation portion 300.

In the example of FIG. 2B, the P-type semiconductor region 313 is disposed in the semiconductor region below the electrode 307. The P-type semiconductor region 313 disposed on a surface of an active region below the electrode 307 is inverted by an electric field applied via an insulating film 330, whereby surface MOS capacitance which is a charge accumulation area is constituted. Alternatively, an N-type semiconductor region may be disposed on a surface of an active region below the electrode 307, whereby a buried MOS capacitance may be formed. A P-type semiconductor region with lower impurity concentration than that of the P-type semiconductor region 313 may be disposed on the surface of the active region below the electrode 307.

The inverted state and non-inverted state of the P-type semiconductor region 313 are switched by the driving pulse pFDINC applied to the electrode 307 via the conductive pattern 306. Therefore, a magnitude of the capacitance value of the capacitance 208 may be switched.

Although a part of the electrode 307 overlaps with the element isolation portion 300 in a plan view in the present embodiment, the electrode 307 does not necessarily have to overlap with the element isolation portion 300. An N-type semiconductor region (hereafter, "additional N-type semiconductor region") may be disposed between the electrode 307 and the element isolation portion 300 in a plan view. If the additional N-type semiconductor region is disposed, the N-type semiconductor region 312 and the additional N-type semiconductor region are disposed adjacent to each other via the electrode 307. The additional N-type semiconductor region, the electrode 307, and the N-type semiconductor region 312 constitute a transistor. Capacitance 208 may be disposed to electrically connect to the additional N-type semiconductor region.

In one embodiment, the N-type semiconductor region 312 (a first semiconductor region) and the element isolation portion 300 are disposed adjacent to each other via the electrode 307 as in the present embodiment. As compared with a case where the N-type semiconductor region 312 is disposed between the electrode 307 and the element isolation portion 300 in a plan view, a subthreshold current flows between the additional N-type semiconductor region and the N-type semiconductor region 312 when a signal is output in a state in which the capacitance 208 is connected to the FD 203, whereby noise generated due to a change in the potential of the input node can be reduced.

A P-type semiconductor region (a second semiconductor region) may be disposed between the electrode 307 and the element isolation portion 300 in a plan view. In this case, the N-type semiconductor region 312, the electrode 307, the P-type semiconductor region (the second semiconductor region), and the element isolation portion 300 are disposed adjacent to one another in this order in a plan view. The P-type semiconductor region (the second semiconductor region) forms an interface with the insulating film 330.

Figure 3:
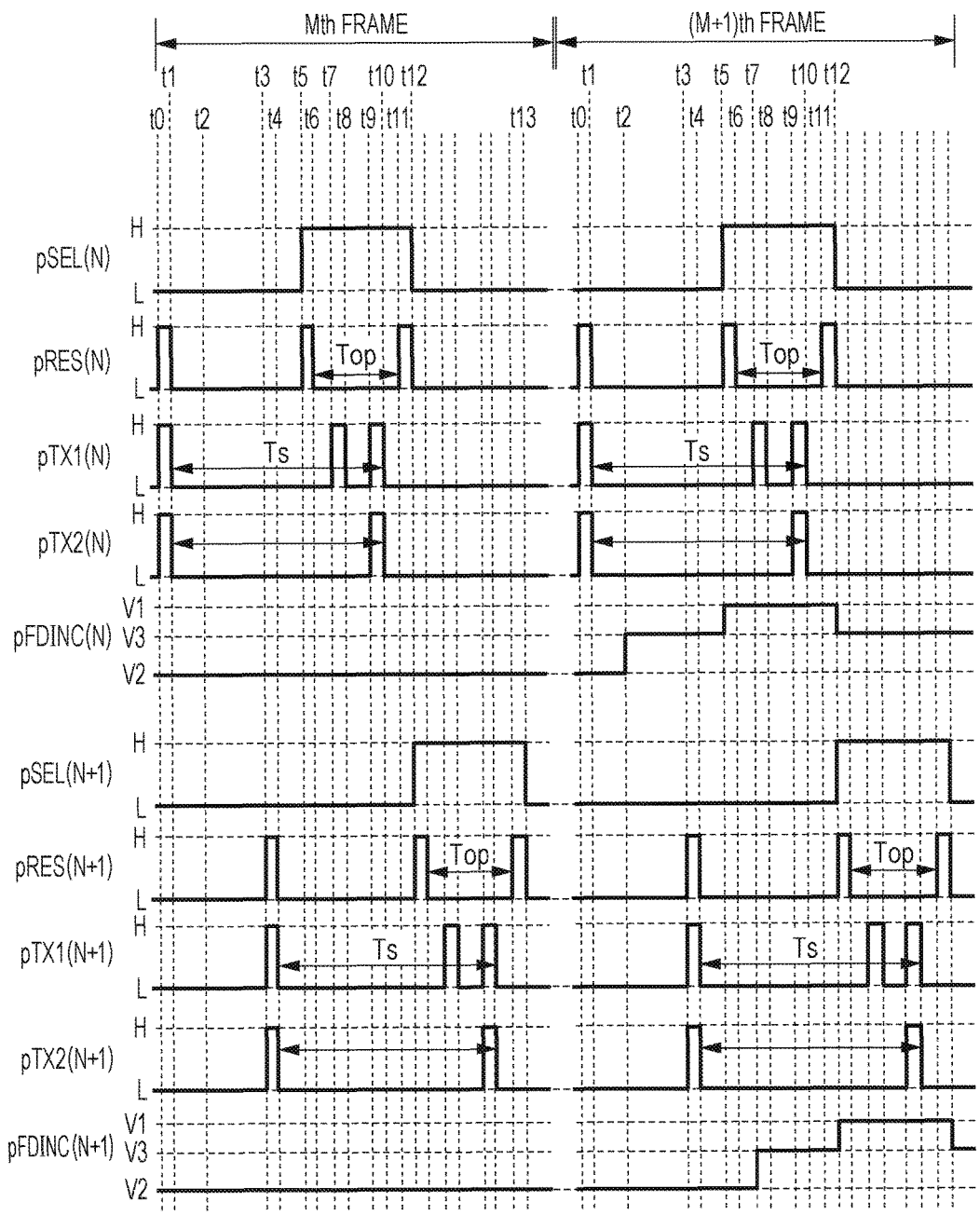
FIG. 3 is a driving pulse diagram.

Next, driving pulses supplied to a pixel 100 of Nth pixel row and a pixel 100 of (N+1)th pixel row arranged in the pixel unit 102 are illustrated in FIG. 3 as examples of driving pulses supplied to a plurality of pixels 100. FIG. 3 illustrates operations in an Mth frame and an (M+1)th frame. In the Mth frame, the switch 207 is in the disconnected state and the capacitance value of the input node of the amplifying transistor 205 is small. In the (M+1)th frame, the switch 207 is switched from the disconnected state to the connected state and the capacitance value of the input node of the amplifying transistor 205 is large. Here, the driving pulses directly related to the feature of the present embodiment will be described.

Each transistor and the switch 207 are set to the connected state when a driving pulse of a high-level (H level) potential is supplied. When a low-level (L level) driving pulse is supplied, each transistor and the switch 207 are set to the disconnected state. A middle-level (M level) potential is a potential between the H level potential and the L level potential. A transistor to which a driving pulse is supplied in the period of the M level potential may be set to the connected state or may be set to the disconnected state.

A first potential V1 corresponds to a H level potential, and a second potential V2 corresponds to an L level potential. A third potential V3 corresponds to an M level potential, and is a potential between the first potential V1 and the second potential V2.

A magnitude of the capacitance value of the capacitance 208 when the potential supplied to the electrode 307 is held by each potential is larger in the order of a first capacitance value when held at the first potential V1, a third capacitance value when held at the third potential V3, and a second capacitance value when held at the second potential V2.

FIG. 3 illustrates examples of driving pulses of the present embodiment. The driving pulse pFDINC indicates a driving pulse supplied to the switch 207.

A charge accumulation period Ts of the pixel begins when the charge accumulated in the photoelectric conversion unit 201 (the photoelectric conversion unit 201A and the photoelectric conversion unit 201B) is reset. The charge accumulation period Ts ends when the charge accumulated in the photoelectric conversion unit 201 (the photoelectric conversion unit 201A and the photoelectric conversion unit 201B) is transferred to the FD 203.

In an output period Top of the signal of the pixel begins in the charge accumulation period and when the reset transistor 204 is switched from the connected state to the disconnected state. The output period Top ends when the signal in accordance with the charge accumulated in the photoelectric conversion unit 201 (the photoelectric conversion unit 201A and the photoelectric conversion unit 201B) is output to the signal line 107.

An operation in the (M+1)th frame will be described first.

At time t0, driving pulses pRES(N), pTX1(N), and pTX2(N) are set to the H level from the L level, and the FD 203, the photoelectric conversion unit 201A, and the photoelectric conversion unit 201B of the pixel 100 of the Nth row are reset.

At time t1, the driving pulses pRES(N), pTX1(N), and pTX2(N) are set to the L level from the H level. Therefore, reset of the photoelectric conversion unit 201A and the photoelectric conversion unit 201B of the pixel 100 of the Nth row ends, and the charge accumulation period of the photoelectric conversion unit 201A and the photoelectric conversion unit 201B of the pixel 100 of the Nth row begins.

At time t2, the driving pulse pFDINC(N) is set to the third potential V3 from the second potential V2. Then, the capacitance value of the capacitance 208 is set to the third capacitance value from the second capacitance value. At time t3, driving pulses pRES(N+1), pTX1(N+1), and pTX2(N+1) are set to the H level from the L level, and the FD 203, the photoelectric conversion unit 201A, and the photoelectric conversion unit 201B of the pixel 100 of the (N+1)th row are reset.

At time t4, the driving pulses pRES(N+1), pTX1(N+1), and pTX2(N+1) are set to the L level from the H level. Then, reset of the photoelectric conversion unit 201A and the photoelectric conversion unit 201B of the pixel 100 of the (N+1)th row ends, and accumulation of a charge of the photoelectric conversion unit 201A and the photoelectric conversion unit 201B of the pixel 100 of the (N+1)th row begins.

At time t5, a driving pulse pSEL(N) is set to the H level from the L level, and a row is selected. Then, the output node of the amplifying transistor 205 and the signal line 107 are electrically connected to each other. The driving pulse pRES(N) is set to the H level from the L level. The driving pulse pFDINC(N) is set to the first potential V1 from the third potential V3. Then, the capacitance value of the capacitance 208 is set to the first capacitance value from the third capacitance value.

At time t6, the driving pulse pRES(N) is set to the L level from the H level, and reset of the FD 203 ends. At time t6, the output period of the pixel begins.

At time t7, the driving pulse pTX1 is set to the H level from the L level, and at time t8, is set to the L level from the H level. With this operation, a charge generated in the photoelectric conversion unit 201A in a period from t1 to t8 is transferred to the FD 203.

A charge accumulation period of the photoelectric conversion unit 201A and the photoelectric conversion unit 201B ends when the driving pulses pTX1 and pTX2 are set to the H level from the L level at time t9, and set to the L level from the H level at time t10.

With this operation, a charge generated in a period from t1 to t10 in the photoelectric conversion unit 201A and the photoelectric conversion unit 201B is held by the FD 203.

At time t11, the driving pulse pRES(N) is set to the H level from the L level, and the output period Top of the pixel ends. At time t12, the driving pulse pRES(N) is set to the L level from the H level, and reset of the FD 203 and the capacitance 208 ends. The driving pulse pSEL(N) is set to the L level from the H level, and selection of the Nth row ends. The driving pulse pFDINC(N) is set to the third potential V3 from the first potential V1. Then, the capacitance value of the capacitance 208 is set to the third capacitance value from the first capacitance value.

Further, a driving pulse pSEL(N+1) and the driving pulse pRES(N+1) are set to the H level from the L level, and selection of the (N+1)th row begins. A first output period of the pixel 100 of the (N+1)th row begins. A driving method of the pixel 100 of the (N+1)th row is the same as the driving method of the pixel 100 in a row selection period of the Nth row.

An operation in an Mth frame differs from the operation in the (M+1)th frame in that the switch 207 keeps the disconnected state.

In a period from t10 to t11 in FIG. 3, the potential of the signal line 107 is output as a signal of the pixel 100 in a state in which the capacitance 208 is electrically connected to the input node of the amplifying transistor 205. The signal output here becomes a signal for image pickup. Although the driving pulse pRES(N) is set to the H level in the period from T11 to T12, the driving pulse pRES(N) may be kept at L level. In that case, the output period Top ends when output of the signal ends.

Further, if needed, a noise signal of the pixel 100 may be obtained by using the potential of the signal line 107 in the period from t6 to t7 as a signal. Noise can be reduced by obtaining a difference between the noise signal and the above-described signal for image pickup.

In the period from t8 to t9, a difference process between a signal in accordance with the charge generated in the photoelectric conversion unit 201A in a state in which the capacitance 208 is electrically connected to the input node of the amplifying transistor 205 and a signal output in the period from t10 to t11 is performed. Then, a signal in accordance with the charge of the photoelectric conversion unit 201B can be obtained. The signal in accordance with the charge generated in the photoelectric conversion unit 201A, and the signal in accordance with the charge of the photoelectric conversion unit 201B obtained at this time can be used as signals other than the signals for image pickup (e.g., signals for focus detection).

If it is unnecessary to obtain signals other than the signals for image pickup, it is unnecessary to set the driving pulse pTX1 to the H level from the L level at time t7.

In the period from t0 to t5, the pRES(N) and the pSEL(N) do not necessarily have to keep the L level. Although the driving pulse pSEL is kept at the H level in the period from t5 to t12, the driving pulse pSEL may be kept at the H level in the period in which the signal held in the input node of the amplifying transistor 205 and the capacitance 208 is output to the signal processing unit 105 illustrated in FIG. 1A. The same applies to other pixel rows and other embodiments.

Although the driving pulse pFDINC(N) is set to the third potential V3 from the second potential V2 at time t2, the driving pulse pFDINC(N) may be set to the third potential V3 before time t1. The driving pulse pFDINC(N) may desirably be kept at the third potential V3 in a process in which the potential supplied to the electrode 307 is set to the first potential V1 from the second potential V2.

The time at which the driving pulse pFDINC(N) is set to the first potential V1 from the third potential V3 is time t5 in the description. However, the driving pulse pFDINC(N) may desirably be set to the first potential V1 from the third potential V3 in a period from the start of the charge accumulation period to the start of the output period (in the period from t1 to t6).

According to the configuration of the present embodiment, since the quantity of the potential which is changed at once becomes smaller, a temporary changing quantity of the potential of the input node becomes smaller. Therefore, unevenness in the time until the potential of the input node is stabilized becomes smaller among a plurality of pixels.

Further, the potential when the input potential of each pixel is stabilized can be set to the reset potential by setting the reset transistor to the connected state as in the present embodiment immediately before the start of the output period of the pixel. Therefore, unevenness in the potential of the input node for each pixel can further be reduced, whereby the noise can be reduced.

In one embodiment, the potential supplied to the driving pulse pFDINC(N) in the charge accumulation period is as low as possible. Specifically, for example, the potential is set to the first potential V1 from the third potential V3 at time t5 at which the selection transistor is set to the connected state than any timing before time t5. Thus, an electric field generated between the electrode 307 and the P-type semiconductor region 313 or between the electrode 307 and the P-type semiconductor region arranged around the element isolation portion 300 in the charge accumulation period of the pixel 100 of the subsequent each pixel row can be reduced. Then, noise caused by hot carriers can be reduced. The same applies to the following embodiments.

Although the potential is kept at the third potential V3 in the present embodiment, the same effect can be obtained even if the changing quantity of the potential per unit time from the second potential V2 to the first potential V1 is reduced. For example, the changing quantity per unit time from the second potential V2 to the first potential V1 of the switch 207 may be smaller than the changing quantity per unit time from an ON potential (a potential for setting to the connected state) to an OFF potential (a potential for setting to the disconnected state) or from the OFF potential to the ON potential of the reset transistor. Such driving pulses are implemented by using a current source in a buffer circuit of a scanning circuit.

In one embodiment, in the period from time t13 of the Mth frame to t0 of the (M+1)th frame, the pFDINC(N) is kept at the second potential V2. Therefore, an unnecessary change in the potential at the input node can be reduced.

Second Embodiment

Figure 4:
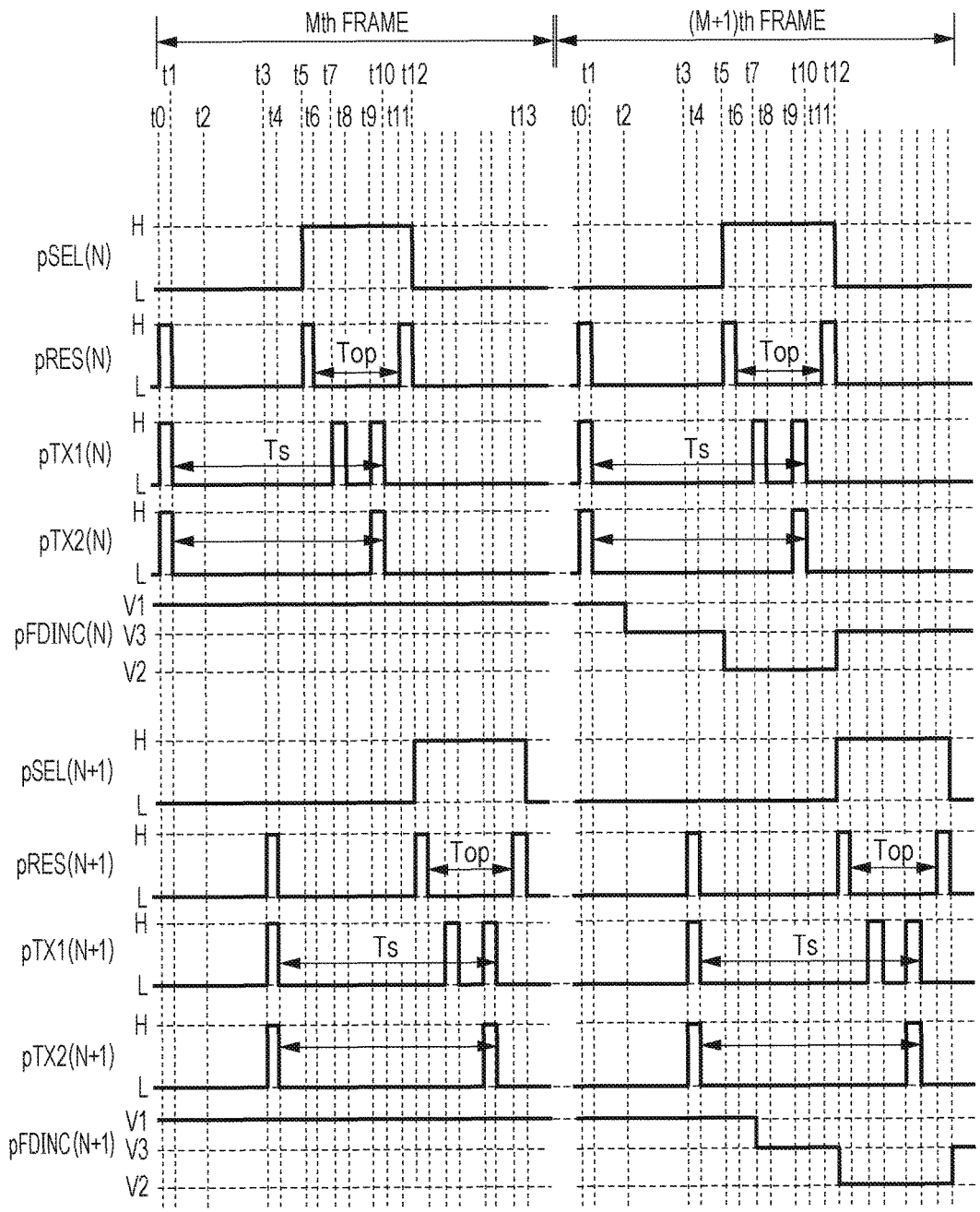
FIG. 4 is a driving pulse diagram.

Driving pulses of an image pickup device 101 of the present embodiment will be described with reference to FIG. 4. In the present embodiment, configurations of FIGS. 1A, 1B, 2A and 2B are the same as those of the first embodiment. Driving pulses pSEL, pRES, pTX1, and pTX2 are driven in the same manner as in FIG. 3, and thus are not described.

A difference between the present embodiment and the first embodiment will be described. In the first embodiment, the potential of the driving pulse pFDINC is kept at the third potential V3 when the capacitance 208 is set to the connected state from the disconnected state with respect to the FD 203. In the second embodiment, a potential of a driving pulse pFDINC is kept at a third potential V3 when capacitance 208 is set to a disconnected state from a connected state with respect to FD 203.

An operation in an (M+1)th frame will be described first.

At time t2, the driving pulse pFDINC is set to the third potential V3 from a first potential V1. At time t5, the driving pulse pFDINC is set to a second potential V2 from the third potential V3. At time t12, the driving pulse pFDINC is set to the third potential V3 from the second potential V2.

According to the configuration of the present embodiment, in a case where capacitance 208 is set to a disconnected state from a connected state with respect to an input node of an amplifying transistor 205, a potential supplied to an electrode 307 is kept at the third potential V3 when the potential is switched from the first potential V1 to the second potential V2.

Although the driving pulse pFDINC(N) is set to the third potential V3 from the first potential V1 at time t2, the driving pulse pFDINC(N) may be set to the third potential V3 before time t1. The driving pulse pFDINC(N) may desirably be kept at the third potential V3 in a process in which the potential is set to the second potential V2 from the first potential V1. The time at which the driving pulse pFDINC (N) is set to the second potential V2 from the third potential V3 is time t5 in the description. However, the driving pulse pFDINC(N) may desirably be set to the second potential V2 from the third potential V3 in a period from the start of a charge accumulation period to the start of an output period (in the period from t1 to t6). Further, the driving pulse pFDINC may be kept at the second potential V2 at time t12 or thereafter, or may be set to the third potential V3 from the second potential V2.

An operation in an Mth frame differs from the operation in the (M+1)th frame in that a switch 207 keeps the connected state. The driving pulse pFDINC is set to the first potential V1 in the period from t0 to t12 in the Mth frame, but the driving pulse pFDINC may desirably be set to the first potential V1 at least at time t5 or thereafter. In one embodiment, the driving pulse pFDINC is set to the second potential V2 than the first potential V1 in the period from t1 to t5. An electric field generated between an electrode 307 and a P-type semiconductor region 313 or between the electrode 307 and a P-type semiconductor region arranged around an element isolation portion 300 in the charge accumulation period can be reduced. Then, noise caused by hot carriers can be reduced.

According to the present embodiment, a potential difference between the electrode 307 and the N-type semiconductor region 312 is smaller than in the case where a potential supplied to the electrode 307 is switched from the first potential V1 to the second potential V2, and a temporary changing quantity of the potential at the input node becomes smaller. Also in this configuration, the same effect as that of the first embodiment can be obtained.

Also in the present embodiment, the same effect can be obtained even if the changing quantity of the potential per unit time from the first potential V1 to the second potential V2 is reduced.

Third Embodiment

Figure 5:
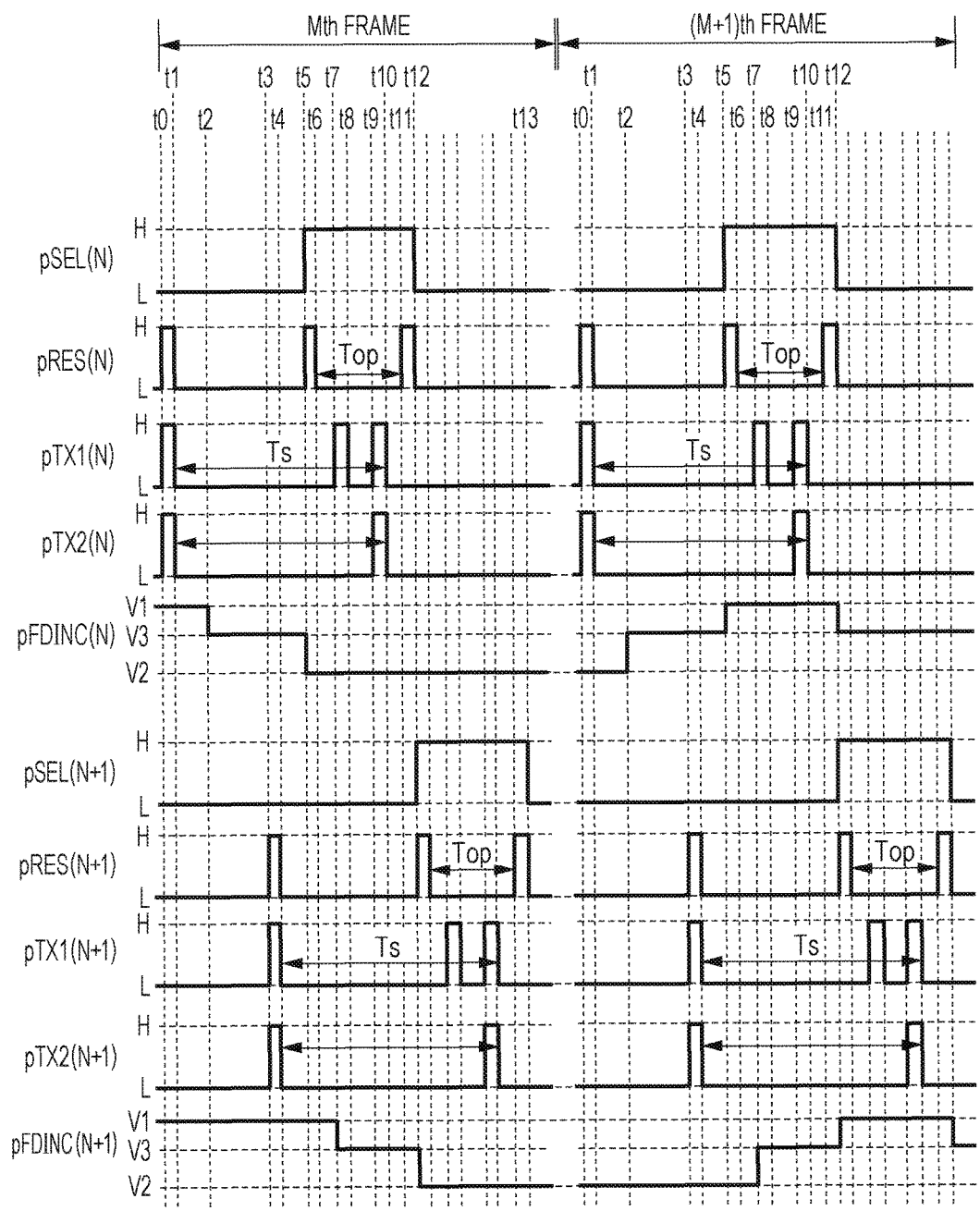
FIG. 5 is a driving pulse diagram.

Driving pulses of an image pickup device 101 of the present embodiment will be described with reference to FIG. 5. In the present embodiment, configurations of FIGS. 1A, 1B, 2A and 2B are the same as those of the first embodiment. Driving pulses pSEL, pRES, pTX1, and pTX2 are driven in the same manner as in FIG. 3, and thus are not described.

The present embodiment differs from the first embodiment and the second embodiment in that a driving pulse pFDINC is kept at a third potential V3 when the capacitance 208 is set to the connected state from the disconnected state with respect to the FD 203 and when the capacitance 208 is set to the disconnected state from the connected state with respect to the FD 203.

An Mth frame will be described first. At time t2, a driving pulse pFDINC(N) is set to the third potential V3 from a first potential V1. At time t5, the driving pulse pFDINC(N) is set to a second potential V2 from the third potential V3.

Here, in a case where capacitance 208 is set to a disconnected state from a connected state with respect to an input node of an amplifying transistor 205, a potential supplied to an electrode 307 is kept at the third potential V3 when the potential is switched from the first potential V1 to the second potential V2.

Although the driving pulse pFDINC(N) is set to the third potential V3 from the first potential V1 at time t2, the driving pulse pFDINC(N) may be set to the third potential V3 before time t1. The driving pulse pFDINC(N) may desirably be kept at the third potential V3 in a process in which the potential is set to the second potential V2 from the first potential V1. The time at which the driving pulse pFDINC (N) is set to the second potential V2 from the third potential V3 is time t5 in the description. However, the driving pulse pFDINC(N) may desirably be set to the second potential V2 from the third potential V3 in a period from the start of a charge accumulation period to the start of an output period (in the period from t1 to t6). The driving pulse pFDINC is kept at the second potential V2 at time t12 and thereafter.

Next, an (M+1)th frame will be described. At time t2, the driving pulse pFDINC(N) is set to the third potential V3 from the second potential V2. At time t5, the driving pulse pFDINC(N) is set to the first potential V1 from the third potential V3.

Here, in a case where the capacitance 208 is set to the connected state from the disconnected state with respect to the input node of the amplifying transistor 205, the potential supplied to the electrode 307 is kept at the third potential V3 when the potential is switched from the second potential V2 to the first potential V1.

Although the driving pulse pFDINC(N) is set to the third potential V3 from the second potential V2 at time t2, the driving pulse pFDINC(N) may be set to the third potential V3 before time t1. The driving pulse pFDINC(N) may desirably be kept at the third potential V3 in a process in which the potential is set to the first potential V1 from the second potential V2. The time at which the driving pulse pFDINC(N) is set to the first potential V1 from the third potential V3 is time t5 in the description. However, the driving pulse pFDINC(N) may desirably be set to the first potential V1 from the third potential V3 in a period from the start of the charge accumulation period to the start of the output period (in the period from t1 to t6).

The driving pulse pFDINC(N) may be set to the third potential V3 or the second potential V2 from the first potential V1 at time t12 or thereafter.

According to the present embodiment, in a case where a potential supplied to the electrode 307 is switched from the first potential V1 to the second potential V2 in a certain frame and then the potential is switched from the second potential V2 to the first potential V1 in the subsequent frame, temporary changing quantities of the potentials at the input node becomes smaller in both frames. Also in this configuration, the same effect as that of the first embodiment can be obtained.

Also in the present embodiment, the same effect can be obtained even if the changing quantity of the potential per unit time from the second potential V2 to the first potential V1 is reduced. Further, the same effect can be obtained even if the changing quantity of the potential per unit time from the first potential V1 to the second potential V2 is reduced.

Fourth Embodiment

Figure 6:
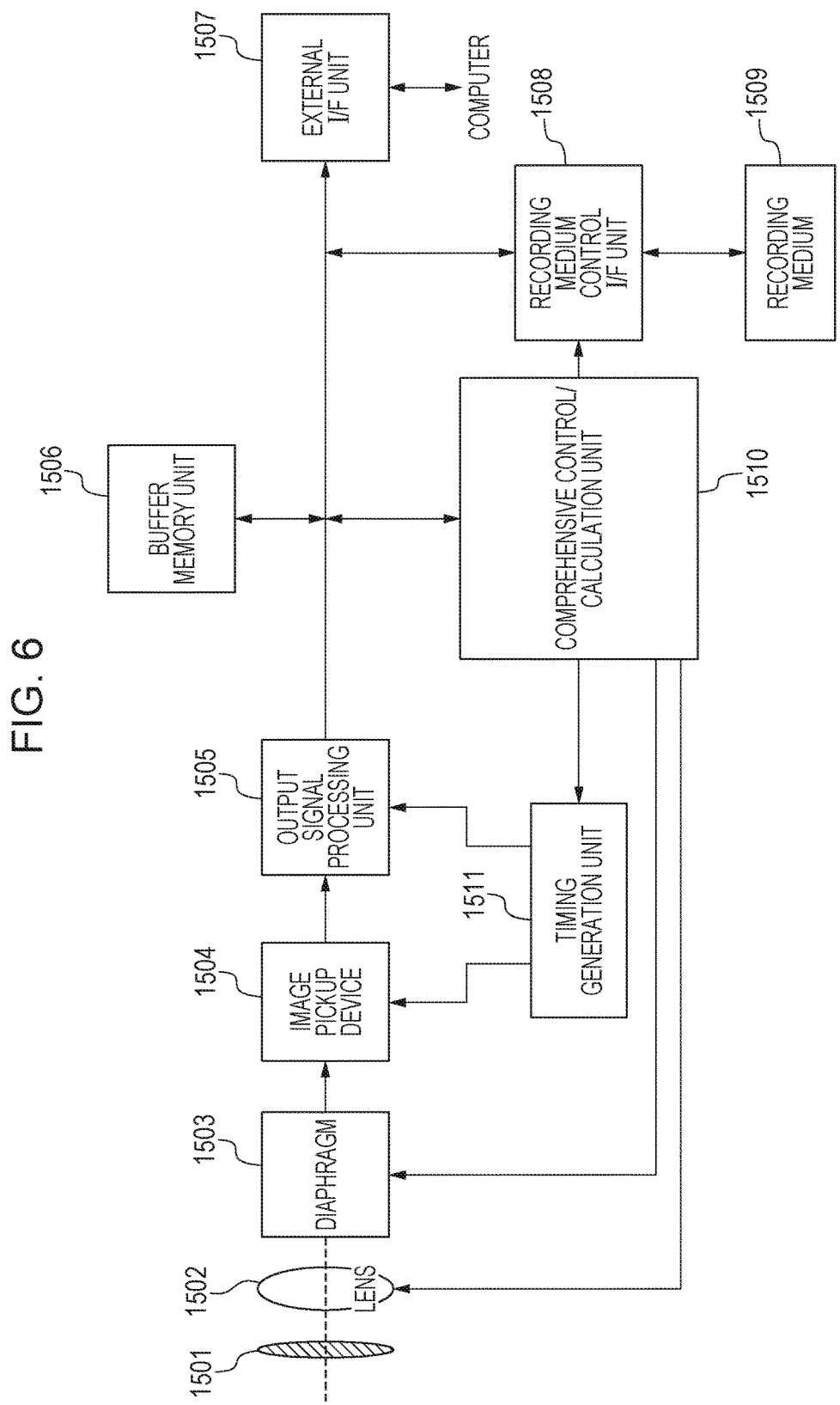
FIG. 6 illustrates a configuration of an image pickup system.

An embodiment of an image pickup system according to the disclosure will be described. Examples of the image pickup system may include a digital still camera, a digital camcorder, a camera head, a copier, a facsimile machine, a mobile phone, an in-vehicle camera, and an observation satellite. FIG. 6 is a block diagram of a digital still camera as an example of the image pickup system.

The present embodiment relates to an image pickup system which includes the image pickup device according to each of the above-described embodiments as an image pickup device 1504.

The image pickup system illustrated in FIG. 6 includes a barrier 1501 for protecting a lens, a lens 1502 for focusing an optical image of an object on the image pickup device 1504, and a diaphragm 1503 for varying light quantity passing through the lens 1502. The lens 1502 and the diaphragm 1503 are an optical system which condenses light to the image pickup device 1504. The image pickup system illustrated in FIG. 6 includes an output signal processing unit 1505 which processes output signals output from the image pickup device 1504. The output signal processing unit 1505 performs various types of correction and compression as needed and outputs the signals.

The output signal processing unit 1505 generates an image using the signals output from the image pickup device 1504.

The image pickup system illustrated in FIG. 6 further includes a buffer memory unit 1506 for temporarily storing image data, and an external interface unit 1507 for communicating with an external computer, for example. The image pickup system further includes a removable recording medium 1509, such as semiconductor memory, in which image data is recorded or from which the image data is read, and a recording medium control interface unit 1508 for recording data in or reading data from the recording medium 1509. The image pickup system further includes a comprehensive control/calculation unit 1510 which controls various calculations and the entire digital still camera, and a timing supply unit 1511 which outputs various timing signals to the image pickup device 1504 and the output signal processing unit 1505. The timing signals and the like may be input from the outside, and the image pickup system may desirably include at least the image pickup device 1504, and the output signal processing unit 1505 which processes output signals output from the image pickup device 1504.

As described in the first embodiment, in each pixel 100, a plurality of photodiodes may be provided to correspond to a single microlens. In this case, the output signal processing unit 1505 processes signals in accordance with charges generated by some of the plurality of photodiodes, and signals in accordance with charges generated by other of the plurality of photodiodes. Distance information from the image pickup device 1504 to the object can thus be obtained. That is, the output signal processing unit 1505 uses signals in accordance with charges generated by some of the plurality of photoelectric conversion units provided corresponding to a single microlens, and signals in accordance with charges generated by other of the plurality of photoelectric conversion units. Then, the output signal processing unit 1505 may obtain the distance information from the image pickup device 1504 to the object. In this case, the signals in accordance with charges generated by other of the plurality of photoelectric conversion units may be obtained by subtracting signals in accordance with charges generated by some of the plurality of photoelectric conversion units from the signals in accordance with the sum of the charges generated by the plurality of photoelectric conversion units.

The output signal processing unit 1505 is provided on a second semiconductor substrate which is separated from a first semiconductor substrate on which the image pickup device 1504 is formed. The first semiconductor substrate and the second semiconductor substrate may be formed as separate chips, or may be integrated to form a single chip.

The image pickup device 1504 includes an AD conversion unit has been described. Alternatively, the AD conversion unit may be included in the output signal processing unit 1505. In this case, the image pickup device 1504 outputs analog signals to the output signal processing unit 1505.

As described above, the image pickup system of the present embodiment is capable of performing an image pickup operation with the image pickup device 1504 applied thereto.

Fifth Embodiment

Figure 7A:
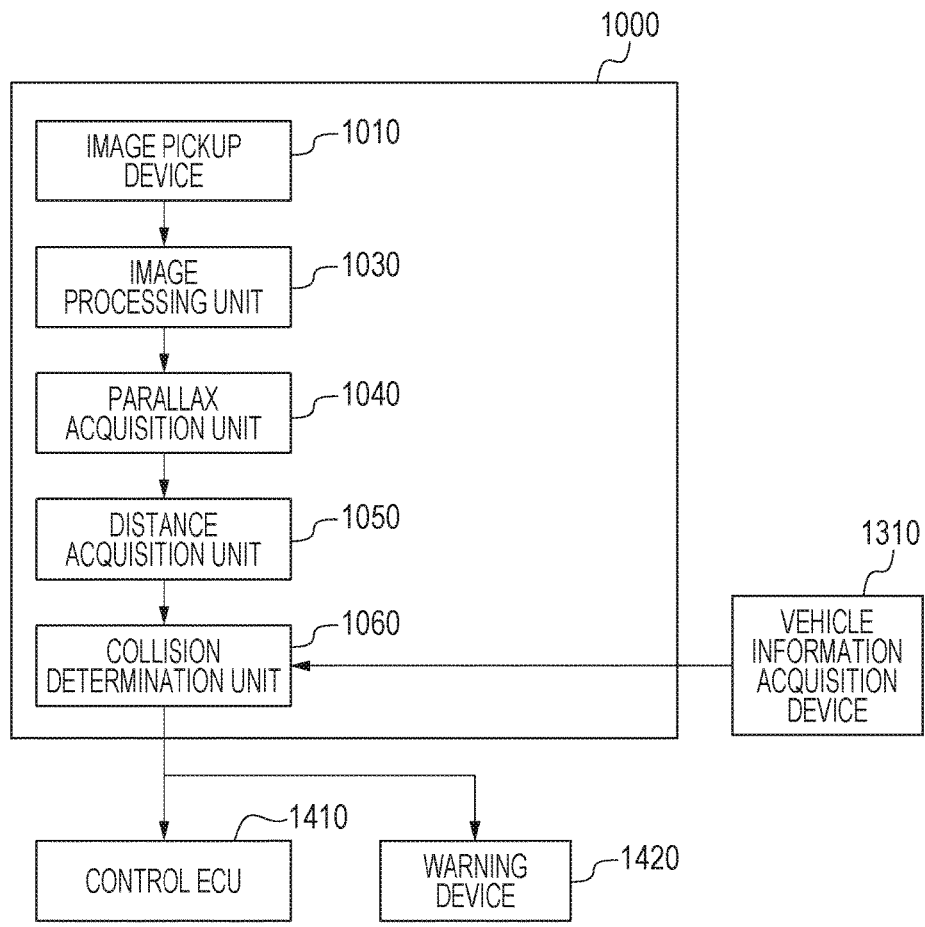
FIGS. 7A and 7B illustrate a configuration of an image pickup system.

FIG. 7A illustrates an example of an image pickup system about an in-vehicle camera. The image pickup system 1000 is an image pickup system provided with the image pickup device of each embodiment described above as an image pickup device 1010. The image pickup system 1000 includes an image processing unit 1030 which performs image processing, and a parallax acquisition unit 1040 which acquires a parallax (a phase difference of a parallax image) from a plurality of pieces of image data acquired by the image pickup system 1000 regarding a plurality of pieces of image data acquired by the image pickup device 1010.

If the image pickup system is a stereoscopic camera including a plurality of image pickup devices 1010, the parallax can be acquired by using signals output from each of a plurality of image pickup devices 1010. The image pickup system may be provided with the image pickup device 1010 which includes a plurality of photoelectric conversion units corresponding to a single microlens. In this case, the parallax acquisition unit 1040 acquires a parallax by processing signals in accordance with charges generated by some of the plurality of photodiodes, and signals in accordance with charges generated by other of the plurality of photodiodes. That is, the parallax acquisition unit 1040 may acquire the parallax using signals in accordance with charges generated by some of the plurality of photoelectric conversion units provided corresponding to a single microlens, and signals in accordance with charges generated by other of the plurality of photoelectric conversion units. In this case, the signals in accordance with charges generated by other of the plurality of photoelectric conversion units may be obtained by subtracting signals in accordance with charges generated by some of the plurality of photoelectric conversion units from the signals in accordance with the sum of the charges generated by the plurality of photoelectric conversion units.

The image pickup system 1000 includes a distance acquisition unit 1050 for acquiring a distance to a target object in accordance with an acquired parallax, and a collision determination unit 1060 for determining whether there is any collision possibility in accordance with the acquired distance. The parallax acquisition unit 1040 and the distance acquisition unit 1050 are examples of a distance information acquisition unit which acquires distance information to the target object. That is, the distance information is information about a parallax, a defocusing amount, a distance to the target object, for example. The collision determination unit 1060 may determine collision possibility using either of these pieces of distance information. The distance information acquisition unit may be implemented by dedicated hardware, by a software module, or by a combination thereof. The distance information acquisition unit may be implemented by a field programmable gate array (FPGA), an application-specific integrated circuit (ASIC), etc. The distance information acquisition unit may also be implemented by a combination of FPGA and ASIC.

The image pickup system 1000 is connected with a vehicle information acquisition device 1310 and can acquire vehicle information, such as a vehicle speed, a yaw rate, and a rudder angle. The image pickup system 1000 is connected with a control ECU 1410 as a control device which outputs control signals with which braking force is generated with respect to a vehicle in accordance with a determination result of the collision determination unit 1060. The image pickup system 1000 is also connected with a warning device 1420 which issues a warning to a driver in accordance with a determination result of the collision determination unit 1060. For example, if the collision determination unit 1060 determines that collision possibility is high, the control ECU 1410 performs vehicle control to avoid a collision or reduce damage by braking, deaccelerating, controlling engine power, and the like. The warning device 1420 warns a user by issuing an audible warning, displaying warning information on a screen of a car-navigation system, etc., vibrating a seat belt or a steering wheel, for example.

In the present embodiment, an image of surroundings of a vehicle, such as the front or the rear of a vehicle, is picked up with the image pickup system 1000.

Figure 7B:
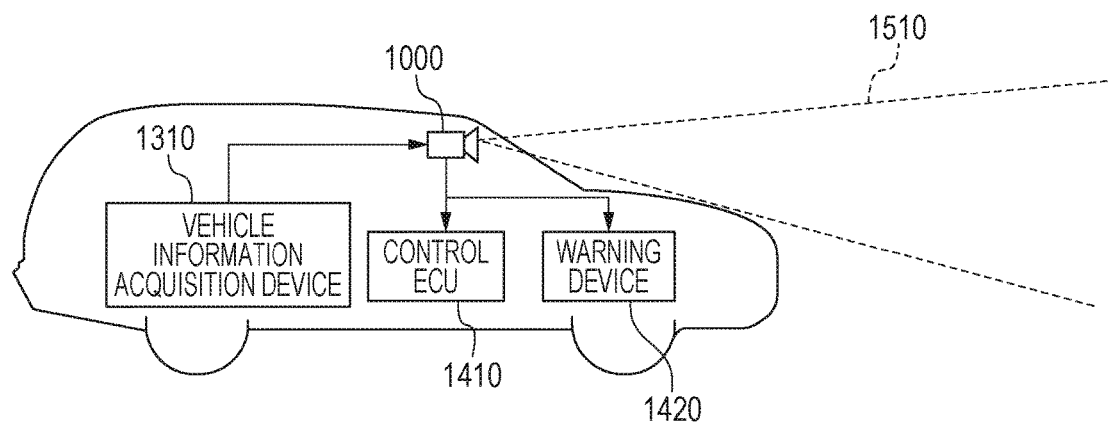

FIG. 7B illustrates an image pickup system for picking up an image of the front of a vehicle. Although the control not to collide with other vehicles has been described, the image pickup system is also applicable to automated vehicle control following other vehicles, and automated vehicle control not to depart from lanes. Further, in addition to vehicles, the image pickup system is also applicable to moving bodies (moving devices), such as a marine vessel, an airplane, and an industrial robot. In addition to moving bodies, the image pickup system is also applicable to various apparatuses which use object recognition, such as an intelligent transport system (ITS).

Note that the above embodiments are illustrative examples for implementing the disclosure, and the technical scope of the disclosure should not be restrictively interpreted thereby. That is, the disclosure is implementable in various forms without departing from the technical spirit or principal features thereof. Each of the described embodiments may be implemented in combination.

According to the disclosure, it is possible to reduce a change in a potential at an input node produced when a potential supplied to a switch for switching a capacitance value of the input node of an amplifying transistor of a pixel is switched.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-086547 filed Apr. 22, 2016, which is hereby incorporated by reference herein in its entirety.

What is claimed is:

1. An image pickup device which includes a plurality of pixels each of which comprises:
   a photoelectric conversion unit;
   an amplifying transistor provided with an input node in which a charge generated in the photoelectric conversion unit is input;
   a transfer transistor configured to switch a connection and a disconnection between the photoelectric conversion unit and the input node;
   a reset transistor configured to switch a connected state and a disconnected state between the input node and a power supply wire; and
   a switch connected to the input node,
   wherein the image pickup device further includes a potential supply unit configured to supply the switch with a first potential, a second potential, and a third potential which is a potential between the first potential and the second potential.

2. An image pickup device which includes a plurality of pixels each of which comprises:
   a photoelectric conversion unit;
   an amplifying transistor provided with an input node in which a charge generated in the photoelectric conversion unit is input; and
   a switch configured to switch a capacitance value of the input node,
   wherein the capacitance value of the input node is set to a first capacitance value when a first potential is supplied to the switch,
   the capacitance value of the input node is set to a second capacitance value which is smaller than the first capacitance value when a second potential is supplied to the switch, and
   the potential supplied to the switch is kept at a third potential which is a potential between the first potential and the second potential in a part of at least one of a period until the potential is set to the first potential from the second potential and a period until the potential is set to the second potential from the first potential.

3. The image pickup device according to claim 1, wherein
   a charge accumulation period of the pixel begins when charges accumulated in the photoelectric conversion unit are reset,
   an output period of the pixel begins when the input node is reset in the charge accumulation period, and
   the potential supplied to the switch is changed from the third potential to the first potential or the second potential in a period from the start of the charge accumulation period to the start of the output period.

4. The image pickup device according to claim 2, wherein
   a charge accumulation period of the pixel begins when charges accumulated in the photoelectric conversion unit are reset, and
   an output period of the pixel begins when the input node is reset in the charge accumulation period, and
   the potential supplied to the switch is changed from the third potential to the first potential or the second potential in a period from the start of the charge accumulation period to the start of the output period.

5. The image pickup device according to claim 1, wherein the pixel further includes a selection transistor configured to switch a connected state and a disconnected state between the amplifying transistor and a signal line,
   a charge accumulation period of the pixel begins when charges accumulated in the photoelectric conversion unit are reset, and
   the potential supplied to the switch is changed from the third potential to the first potential or the second potential in a period until the selection transistor sets the amplifying transistor and the signal line to the connected state after the start of the charge accumulation period.

6. The image pickup device according to claim 2, wherein the pixel further includes a selection transistor configured to switch a connected state and a disconnected state between the amplifying transistor and a signal line, a charge accumulation period of the pixel begins when charges accumulated in the photoelectric conversion unit are reset, and the potential supplied to the switch is changed from the third potential to the first potential or the second potential in a period from the start of the charge accumulation period to the start of the output period.

7. The image pickup device according to claim 3, wherein the pixel further includes a selection transistor configured to switch a connected state and a disconnected state between the amplifying transistor and a signal line, and the selection transistor is set to the connected state before the start of the output period, and the potential supplied to the switch is changed from the third potential to the first potential or the second potential in a period after the selection transistor is set to the connected state until the output period begins.

8. The image pickup device according to claim 4, wherein the pixel further includes a selection transistor configured to switch a connected state and a disconnected state between the amplifying transistor and a signal line, and the selection transistor is set to the connected state before the start of the output period, and the potential supplied to the switch is changed from the third potential to the first potential or the second potential in a period after the selection transistor is set to the connected state until the output period begins.

9. The image pickup device according to claim 3, further comprising a signal line, wherein, after the amplifying transistor outputs a signal in accordance with a charge generated in the photoelectric conversion unit in the charge accumulation period to the signal line, the potential supplied to the switch is changed from the first potential to the second potential, or from the first potential to the third potential.

10. The image pickup device according to claim 4, further comprising a signal line, wherein, after the amplifying transistor outputs a signal in accordance with a charge generated in the photoelectric conversion unit in the charge accumulation period to the signal line, the potential supplied to the switch is changed from the first potential to the second potential, or from the first potential to the third potential.

11. The image pickup device according to claim 1, wherein the pixel includes capacitance, the switch switches a connected state and a disconnected state between the input node and the capacitance, and the capacitance is surface MOS capacitance or buried MOS capacitance.

12. The image pickup device according to claim 1, wherein an active region divided by an element isolation portion, wherein a first semiconductor region which holds a signal charge and is a part of the input node is disposed in the active region, an electrode to which the first potential, the second potential, and the third potential of the switch are supplied is disposed above the active region, and the first semiconductor region and the element isolation portion are disposed adjacent to each other via the electrode in a plan view.

13. The image pickup device according to claim 2, further comprising an active region divided by an element isolation portion, wherein a first semiconductor region which holds a signal charge and is a part of the input node is disposed in the active region, an electrode to which the first potential, the second potential, and the third potential of the switch are supplied is disposed above the active region, and the first semiconductor region and the element isolation portion are disposed adjacent to each other via the electrode in a plan view.

14. The image pickup device according to claim 1, further comprising an active region divided by an element isolation portion, wherein a first semiconductor region which holds a signal charge and is a part of the input node, and a second semiconductor region of a conductivity type opposite to that of the first semiconductor region are disposed in the active region, an insulating film is disposed on the active region, the active region and the insulating film form an interface, an electrode to which the first potential, the second potential, and the third potential of the switch are supplied is disposed above the active region, and the first semiconductor region, the electrode, the second semiconductor region, and the element isolation portion are disposed adjacent to one another in this order in a plan view, and the second semiconductor region and the insulating film form an interface.

15. The image pickup device according to claim 2, further comprising an active region divided by an element isolation portion, wherein a first semiconductor region which holds a signal charge and is a part of the input node, and a second semiconductor region of a conductivity type opposite to that of the first semiconductor region are disposed in the active region, an insulating film is disposed on the active region, the active region and the insulating film form an interface, an electrode to which the first potential, the second potential, and the third potential of the switch are supplied is disposed above the active region, and the first semiconductor region, the electrode, the second semiconductor region, and the element isolation portion are disposed adjacent to one another in this order in a plan view, and the second semiconductor region and the insulating film form an interface.

16. The image pickup device according to claim 1, wherein each of the plurality of pixels includes a microlens, and a plurality of photoelectric conversion units which generate a charge in accordance with light which penetrates the microlens.

17. The image pickup device according to claim 1, wherein at least one of a changing quantity of the potential per unit time until the potential is set to the first potential from the second potential and a changing quantity of the potential per unit time until the potential is set to the second potential from the first potential is smaller than a changing quantity of the potential per unit time until an ON potential supplied to a gate of the reset transistor is changed to an OFF potential.

18. The image pickup device according to claim 1, wherein
the potential supplied to the switch is kept at a third potential which is a potential between the first potential and the second potential in a part of at least one of a period until the potential is set to the first potential from the second potential and a period until the potential is set to the second potential from the first potential.

19. An image pickup system, comprising:
an image pickup device, and
a signal processing unit configured to generate an image using a signal output from the image pickup device,
the image pickup device including a plurality of pixels each of which includes
a photoelectric conversion unit,
an amplifying transistor provided with an input node in which a charge generated in the photoelectric conversion unit is input,
a transfer transistor configured to switch a connection and a disconnection between the photoelectric conversion unit and the input node,
a reset transistor configured to switch a connected state and a disconnected state between the input node and a power supply wire, and
a switch connected to the input node,
wherein the image pickup device further includes a potential supply unit configured to supply the switch with a first potential, a second potential, and a third potential which is a potential between the first potential and the second potential.

20. A moving body, comprising:
an image pickup device;
a distance information acquisition unit configured to acquire distance information to a target object in accordance with a signal from the image pickup device; and
a control unit configured to control the moving body in accordance with the distance information,
the image pickup device including a plurality of pixels each of which includes
a photoelectric conversion unit,
an amplifying transistor provided with an input node in which a charge generated in the photoelectric conversion unit is input, and
a transfer transistor configured to switch a connection and a disconnection between the photoelectric conversion unit and the input node,
a reset transistor configured to switch a connected state and a disconnected state between the input node and a power supply wire, and
a switch connected to the input node,
wherein the image pickup device further includes a potential supply unit configured to supply the switch with a first potential, a second potential, and a third potential which is a potential between the first potential and the second potential.

* * * * *